United States Patent [19]

Becker et al.

[11] Patent Number: 5,164,141

[45] Date of Patent: Nov. 17, 1992

[54] PROCESS FOR THE CONTINUOUS PRODUCTION OF LAMINATED SHEETS

[75] Inventors: Robert Becker, Leverkusen; Gerd Goldmann, Krefeld; Thomas Elsner, Duesseldorf; Wolfgang Lindner, Dormagen, all of Fed. Rep. of Germany

[73] Assignee: Bayer Aktiengesellschaft, Fed. Rep. of Germany

[21] Appl. No.: 666,244

[22] Filed: Mar. 8, 1991

[30] Foreign Application Priority Data

Mar. 22, 1990 [DE] Fed. Rep. of Germany ....... 4009182

[51] Int. Cl.⁵ .............................................. B29C 43/28
[52] U.S. Cl. .................................. 264/257; 156/309.6; 156/324; 264/171
[58] Field of Search ................ 264/257, 171; 156/324, 156/309.6

[56] References Cited

U.S. PATENT DOCUMENTS

| | | | |
|---|---|---|---|
| 3,058,165 | 10/1962 | Purvis | 264/257 |
| 3,976,528 | 8/1976 | James | 156/324 |
| 4,030,953 | 6/1977 | Rutschow et al. | 264/257 |
| 4,188,358 | 2/1980 | Withoos et al. | 264/257 |
| 4,297,408 | 10/1981 | Stead et al. | 156/324 |
| 4,469,543 | 9/1984 | Segal et al. | 156/324 |
| 4,803,022 | 2/1989 | Barrell | 264/257 |
| 4,915,896 | 4/1990 | Rachal | 264/257 |
| 4,983,247 | 1/1991 | Kim | 264/257 |
| 5,024,714 | 6/1991 | Lemelson | 156/324 |

FOREIGN PATENT DOCUMENTS

| | | |
|---|---|---|
| 0327838 | 8/1989 | European Pat. Off. |
| 3200593 | 9/1982 | Fed. Rep. of Germany |
| 3413434 | 10/1985 | Fed. Rep. of Germany |
| 3238160 | 5/1986 | Fed. Rep. of Germany |
| 250090 | 9/1987 | Fed. Rep. of Germany |

*Primary Examiner*—James Lowe
*Attorney, Agent, or Firm*—Connolly & Hutz

[57] ABSTRACT

A process for the continuous production of laminated sheet materials of thermoplastic polymers, reinforcing fibers and metals, in which endless sheets of reinforcing fibers, thermoplastic polymers and metals are combined in layers and the layers thus combined are continuously exposed for 0.1 to 10 minutes to a pressure of 0.5 to 50 bar at a temperature 20° to 150° C. above the melting temperature of the thermoplastic polymer.

1 Claim, No Drawings

PROCESS FOR THE CONTINUOUS PRODUCTION OF LAMINATED SHEETS

This invention relates to a process for the continuous production of laminated sheet materials of thermoplastic polymers, reinforcing fibers and metals, characterized in that endless sheets of reinforcing fibers, thermoplastic polymers—preferably also in the form of endless sheets—and metals—preferably also in the form of sheets—are combined in layers and the layers thus combined are continuously exposed for 0.1 to 10 minutes to a pressure of 0.5 to 50 bar at a temperature 20° to 150° C. above the melting temperature of the thermoplastic polymer.

The laminated sheet materials according to the invention ultimately consist of layers of reinforcing fibers impregnated with the thermoplastic polymers and of metal layers in any arrangement. In the simplest case, a plastic-impregnated fiber layer is combined with a metal layer. A sandwich structure comprising a metal layer between two layers of reinforced plastic or a layer of reinforced plastic between two metal layers is also possible as, of course, are structures comprising several alternating layers of metal and reinforced plastic.

In the context of the invention, sheets of reinforcing fibers are, primarily, woven fabrics, knitted fabrics and nonwovens. Suitable reinforcing fibers are, for example, inorganic reinforcing fibers of, for example, inorganic materials, such as silicate and non-silicate glasses of various kinds, carbon, boron, silicon carbide, metals, metal alloys, metal oxides, metal nitrides, metal carbides and silicates, and organic fibers, of natural and synthetic polymers, for example polyacrylonitriles, polyesters, ultra-highly stretched polyolefin fibers, polyamides, polyimides, aramides, liquid crystal polymers, polyphenylene sulfides, polyether ketones, polyether ether ketones, polyether imides, cotton and cellulose. High-melting materials are preferred and include, for example, glasses, carbon, aramides, liquid crystal polymers, polyphenylene sulfides, polyether ketones, polyether ether ketones and polyether imides.

The reinforcing fibers may be uniformly distributed in the laminate according to the invention although, in certain parts of the material, for example at the edges and/or special reinforcing zones, they may be present in higher concentrations than in other parts of the material.

Sheets of thermoplastic polymers are films or fiber-based sheets as in the case of the reinforcing fibers.

Sheets of metals are, preferably, foils although flat materials made, for example, from wires, such as nets, woven materials, knitted materials, are also suitable.

Plastics suitable for use in accordance with the invention are, for example, thermoplastics in the broadest sense, i.e. polymers which show reversible or intermediate thermoplastic behavior, for example thermoplastic polymers and thermoplastic phases of thermosets. Examples of thermoplastics are polyolefins, vinyl polymers, such as polyvinyl halides, polyvinyl esters, polyvinyl ethers; polyacrylates, polymethacrylates and organic cellulose esters and also polyamides, polyurethanes, polyureas, polyimides, polyesters, polyethers, polystyrenes, polyhydantoins, polyphenylene oxides, polyphenylene sulfides, polysulfones, polycarbonates, phenolic resin precursors, furan resin precursors, melamine resin precursors, epoxy resin precursors, compounds containing double bonds capable of polymerization and/or polyaddition, polyamide precursors, polyether ketones, polyether ether ketones, polyether sulfones, polyether imides, polyamide imides, polyfluoroalkenes, polyester carbonates and liquid crystal polymers; apolar thermoplastic polymers (for example polyolefins) onto which polar groups have been grafted.

Preferred thermoplastics are polyethylenes, polypropylenes, polybutylenes, polypentenes, polyvinyl chlorides, polymethyl methacrylates, polyacrylonitriles, polymethacrylonitriles, polystyrene-containing multi-phase plastics, such as ABS, polyamides of the 6 type, polyamides of the 6,6 type, polyurethanes, polyethylene terephthalates, polybutylene terephthalates, bisphenol A polycarbonates, polyphenylene sulfides, polyether ketones, polyether ether ketones, polyether sulfones, polysulfones, polyether imides, polyamide imides, polyester carbonates, liquid crystal polymers and polypropylene onto which polar groups have been grafted.

The thermoplastics may also be present in various combinations, for example as copolymers, block copolymers, graft polymers, copolymers and polymer mixtures.

The plastics may also be added in powder form or in the form of a melt.

Suitable metals are, for example, aluminium, lead, bronze, chromium, iron, gold, copper, brass, molybdenum, nickel, silver, steel, titanium, zinc and tin, preferably aluminium and copper.

The metals may also be added in powder form or as cuttings.

The laminates are generally produced as follows:

The laminates are preferably produced in laminator presses with which large quantities of the laminate can be produced very economically.

Sheets of reinforcing fibers, thermoplastic polymers and metals, for example in an alternating layer sequence, are drawn together into the gap of a laminator press. Where the thermoplastics are introduced in the form of films or powders, the laminator press comprises at least one heating zone and one cooling zone.

The laminates produced in accordance with the invention and their use, for example as circuit boards, are known in principle. Thus, European patent 291 629 describes a process for the production of a resin-impregnated fabric web laminated with copper foil. However, this process starts out from the actual resin-impregnated fabric web and does not give an entirely satisfactory result.

EXAMPLES

Example 1

Polyamide-6 film and glass cloth (linen weave; a product of Interglas; quality 92150, weight per unit area 345 g/m$^2$, warp 6*68*5 tex; weft 5, 3*272 tex), width 600 mm, were drawn in an alternating sequence over one another—with aluminium foils as outer layers—into a laminator press. A product having very good adhesion properties was produced under the following conditions: temperature 340° C., pressure 13 bar, take-off rate 1.5 m/min. The core layer without aluminium foil has a glass content of 74% by weight and a PA 6 content of 26% by weight. The modulus of elasticity in bending measures 26.3 GPa, flexural strength 145 MPa and elongation 2.2%, as determined by bending tests.

Example 2

Polyamide-6 film and copper cloth were drawn in an alternating sequence into a laminator press. A product having very good screening properties was produced under the following conditions: temperature 340° C., pressure 20 bar, take-off rate 1.2 m/minute. The laminate has a copper content of 40% by volume and a PA 6 content of 60% by volume.

The products are distinguished by a combination of high strength and characteristic metal properties, such as electrical conductivity, shielding effect, brightness, solvent resistance, etc.

We claim:

1. A process for the continuous production of laminated sheet materials of thermoplastic polymers, reinforcing fibers and metals, comprising the steps of continuously combining in layers endless sheet materials of reinforcing fibers, thermoplastic polymers and metals and continuously exposing the layers thus combined for 0.1 to 10 minutes to a pressure of 0.5 to 50 bar at a temperature 20° to 150° C. above the melting temperature of the thermoplastic polymer.

* * * * *